US009946821B2

(12) United States Patent
Miyakawa

(10) Patent No.: US 9,946,821 B2
(45) Date of Patent: Apr. 17, 2018

(54) BASE STATION DESIGN ASSIST SYSTEM UTILIZING UNMANNED AERIAL VEHICLE, AND SERVER USED FOR THE SYSTEM

(71) Applicant: SoftBank Corp., Tokyo (JP)

(72) Inventor: Junichi Miyakawa, Overland Park, KS (US)

(73) Assignee: SoftBank Corp., Tokyo (JP)

( * ) Notice: Subject to any disclaimer, the term of this patent is extended or adjusted under 35 U.S.C. 154(b) by 283 days.

(21) Appl. No.: 15/046,446

(22) Filed: Feb. 18, 2016

(65) Prior Publication Data
US 2017/0083645 A1 Mar. 23, 2017

Related U.S. Application Data

(63) Continuation of application No. PCT/JP2016/054022, filed on Feb. 10, 2016.

(60) Provisional application No. 62/220,990, filed on Sep. 19, 2015, provisional application No. 62/239,386, filed on Oct. 9, 2015.

(51) Int. Cl.
| | |
|---|---|
| *G05D 1/00* | (2006.01) |
| *G06F 17/50* | (2006.01) |
| *B64C 39/02* | (2006.01) |
| *G07C 5/00* | (2006.01) |
| *G01C 21/20* | (2006.01) |
| *H04B 17/00* | (2015.01) |

(52) U.S. Cl.
CPC ........ *G06F 17/5009* (2013.01); *B64C 39/022* (2013.01); *B64C 39/024* (2013.01); *G01C 21/20* (2013.01); *G05D 1/0094* (2013.01); *G07C 5/008* (2013.01); *H04B 17/00* (2013.01); *B64C 2201/123* (2013.01); *B64C 2201/127* (2013.01); *B64C 2201/148* (2013.01); *B64C 2201/208* (2013.01)

(58) Field of Classification Search
CPC .. G06F 17/5009; G05D 1/0094; H04B 17/00; G07C 5/008; G01C 21/20; B64C 39/022; B64C 39/024; B64C 2201/127; B64C 2201/148; B64C 2201/208; B64C 2201/123
See application file for complete search history.

(56) References Cited

U.S. PATENT DOCUMENTS

| | | | |
|---|---|---|---|
| 9,245,428 B2* | 1/2016 | Weddle | G05D 1/005 |
| 2010/0286859 A1* | 11/2010 | Feigh | G05D 1/0044 |
| | | | 701/25 |

* cited by examiner

*Primary Examiner* — Ian Jen

(57) ABSTRACT

To provide a system comprising: an unmanned aerial vehicle; and a free space location database, wherein the unmanned aerial vehicle has: a camera that is capable of 360°-image capturing on a horizontal plane; a positioning apparatus that measures a location of the unmanned aerial vehicle; a direction measuring apparatus that measures a direction of the unmanned aerial vehicle; an altitude measuring apparatus that measures an altitude of the unmanned aerial vehicle; and an information transmitting unit that transmits, to the free space location database, camera image data captured by the camera at every predetermined altitude, and the location, direction and altitude of the unmanned aerial vehicle at time of image capturing by the camera, and based on the camera image data, and the location, direction and altitude of the unmanned aerial vehicle, the free space location database corrects 3D data including terrain information to generate free space location data.

10 Claims, 5 Drawing Sheets

BASE STATION DESIGN ASSIST SYSTEM UTILIZING UNMANNED AERIAL VEHICLE, AND SERVER USED FOR THE SYSTEM

The contents of the following patent application(s) are incorporated herein by reference:
PCT/JP2016/054022 filed on Feb. 10, 2016;
No. 62/220,990 filed in U.S. on Sep. 19, 2015; and
No. 62/239,386 filed in U.S. on Oct. 9, 2015

BACKGROUND

1. Technical Field

The present invention relates to a base station design assist system utilizing an unmanned aerial vehicle, and a server used for the system.

2. Related Art 3D data used for base station design simulation does not include data of obstacles to radio waves, such as woods and structures on roofs of buildings (such as signboards).

For this reason, errors have occurred in simulation results about a minimum antenna altitude needed to attain target area coverage. Therefore, an unnecessarily high tower has been needed to be constructed for a radio wave base station.

SUMMARY

A first aspect of the present invention provides a system comprising: an unmanned aerial vehicle; and a free space location database, wherein the unmanned aerial vehicle has: a camera that is capable of 360°-image capturing on a horizontal plane; a positioning apparatus that measures a location of the unmanned aerial vehicle; a direction measuring apparatus that measures a direction of the unmanned aerial vehicle; an altitude measuring apparatus that measures an altitude of the unmanned aerial vehicle; and an information transmitting unit that transmits, to the free space location database, camera image data captured by the camera at every predetermined altitude, and the location, direction and altitude of the unmanned aerial vehicle at time of image capturing by the camera, and based on the camera image data, and the location, direction and altitude of the unmanned aerial vehicle, the free space location database corrects 3D data including terrain information to generate free space location data.

Based on the free space location data, the free space location database may perform simulation of a minimum antenna installation altitude needed to attain predetermined area coverage in base station setting. The altitude measuring apparatus may measure the altitude of the unmanned aerial vehicle by using an ultrasonic altitude sensor. The system may further comprise a reel winding-type mooring cable attached to the unmanned aerial vehicle and a foundation to house the unmanned aerial vehicle, wherein the altitude measuring apparatus may handle a cable length measured by a reel of the reel winding-type mooring cable as the altitude of the unmanned aerial vehicle. The system may further comprise the foundation, wherein the foundation may have a function of housing the unmanned aerial vehicle, a reel-type mooring function, and a truck. The unmanned aerial vehicle may further have a measuring apparatus that measures an intensity/a source direction of incoming radio waves, and the information transmitting unit may transmit the intensity/source direction of the incoming radio waves to the free space location database. Based on the free space location data, and interference predicted from the intensity/source direction of the incoming radio waves, the free space location database may perform simulation of a minimum antenna installation altitude needed to attain predetermined area coverage in base station setting. The unmanned aerial vehicle may further have a distance measuring apparatus that measures a distance to a subject of a camera image captured by the camera, the information transmitting unit may transmit, to the free space location database, the distance in addition to the camera image data, the location, the direction and the altitude, and based on the camera image data, the location, direction and altitude of the unmanned aerial vehicle, and the distance to the subject, the free space location database may correct 3D data including terrain information to generate free space location data.

A second aspect of the present invention provides an unmanned aerial vehicle comprising: a camera that is capable of 360°-image capturing on a horizontal plane; a positioning apparatus that measures a location of the unmanned aerial vehicle; a direction measuring apparatus that measures a direction of the unmanned aerial vehicle; an altitude measuring apparatus that measure an altitude of the unmanned aerial vehicle; a measuring apparatus that measures an intensity/a source direction of incoming radio waves; and an information transmitting unit that transmits camera image data captured by the camera at every predetermined altitude, the location, direction and altitude of the unmanned aerial vehicle at time of image capturing by the camera, and the intensity/source direction of incoming radio waves.

Also, a third aspect of the present invention provides a server comprising a free space location database that receives, from an unmanned aerial vehicle, camera image data, and a location, a direction and an altitude of the unmanned aerial vehicle at time of image capturing by a camera, and, based on the camera image data, and the location, direction and altitude of the unmanned aerial vehicle that have been received, corrects 3D data including terrain information to generate free space location data, wherein the unmanned aerial vehicle has: the camera that is capable of 360°-image capturing on a horizontal plane; a positioning apparatus that measures the location of the unmanned aerial vehicle; a direction measuring apparatus that measures the direction of the unmanned aerial vehicle; an altitude measuring apparatus that measures the altitude of the unmanned aerial vehicle; and an information transmitting unit that transmits the camera image data captured by the camera at every predetermined altitude, and the location, direction and altitude of the unmanned aerial vehicle at time of image capturing by the camera.

The summary clause does not necessarily describe all necessary features of the embodiments of the present invention. The present invention may also be a sub-combination of the features described above.

DESCRIPTION OF EXEMPLARY EMBODIMENTS

Figure 1:
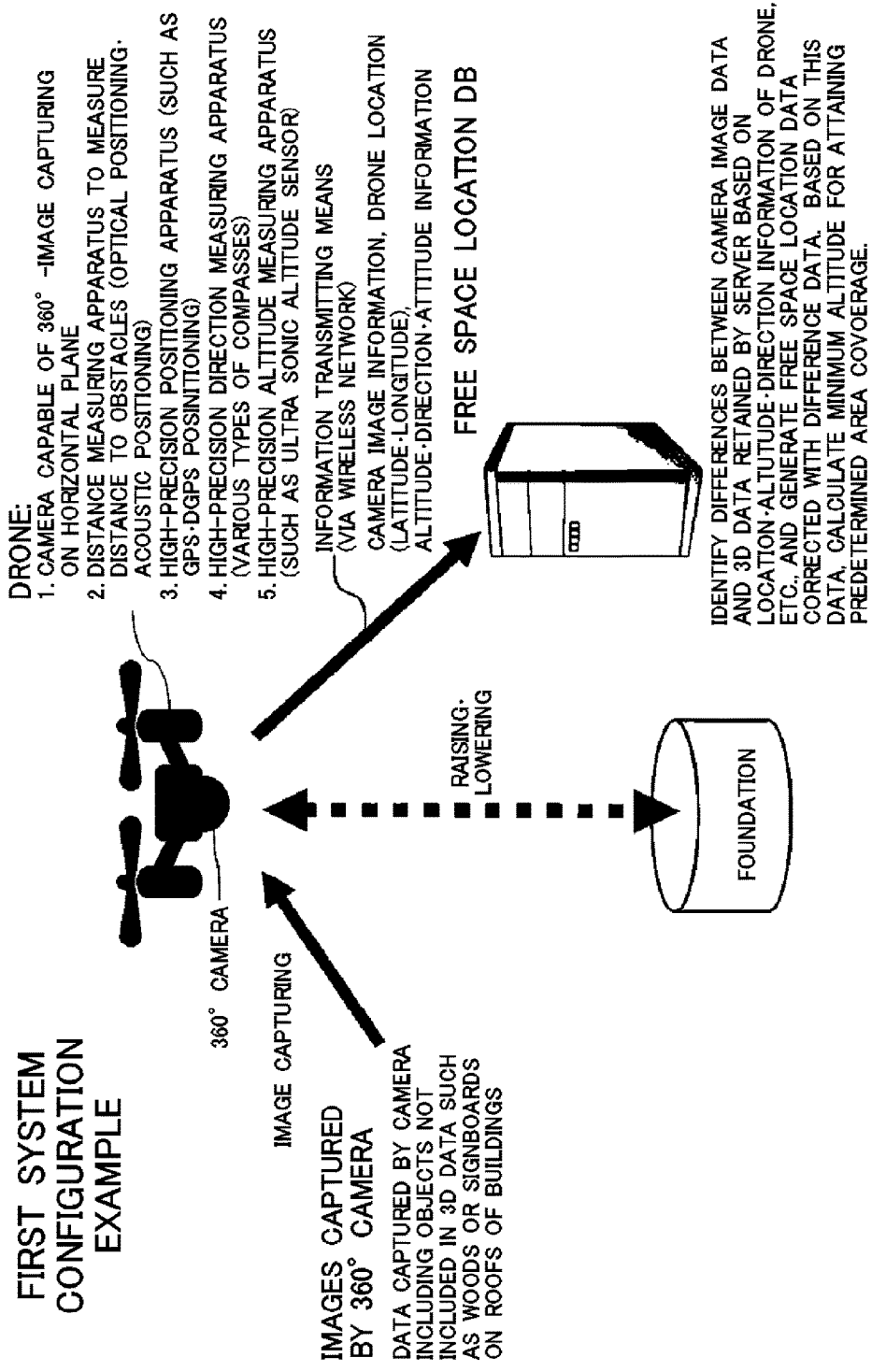
FIG. 1 schematically illustrates a first system configuration example.
Figure 2:
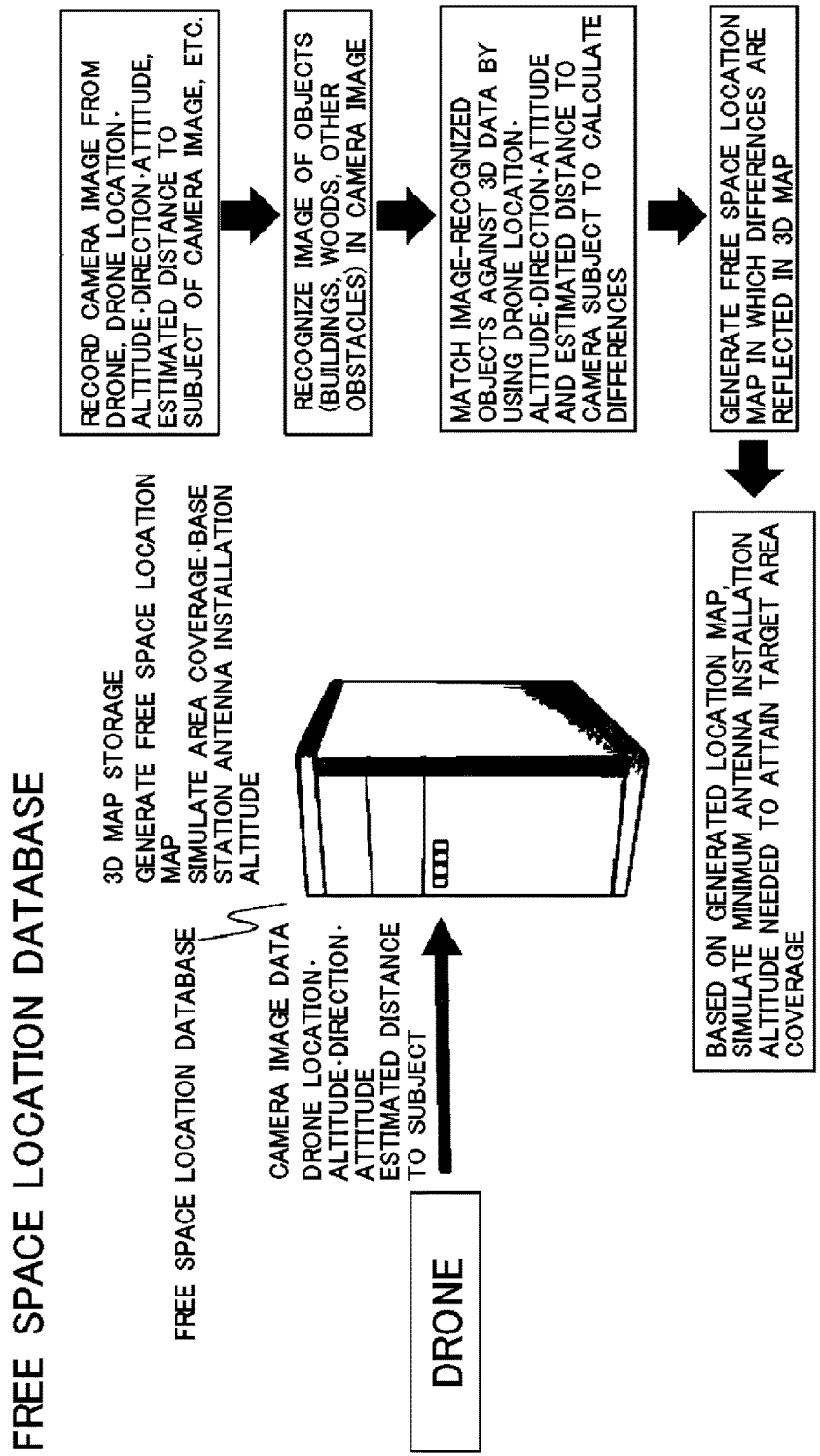
FIG. 2 schematically illustrates one example of a free space location database.
Figure 3:
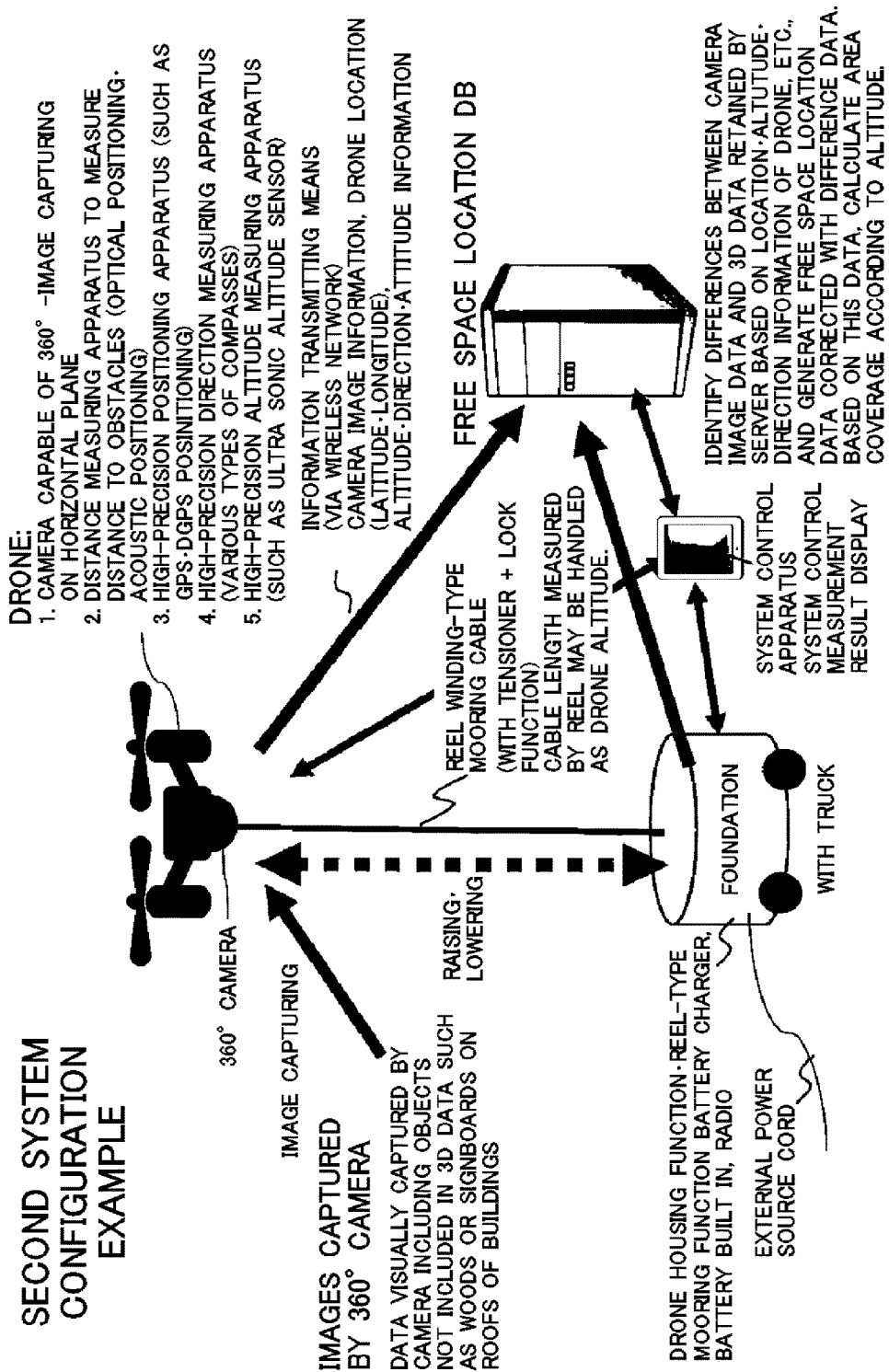
FIG. 3 schematically illustrates a second system configuration example.
Figure 4:
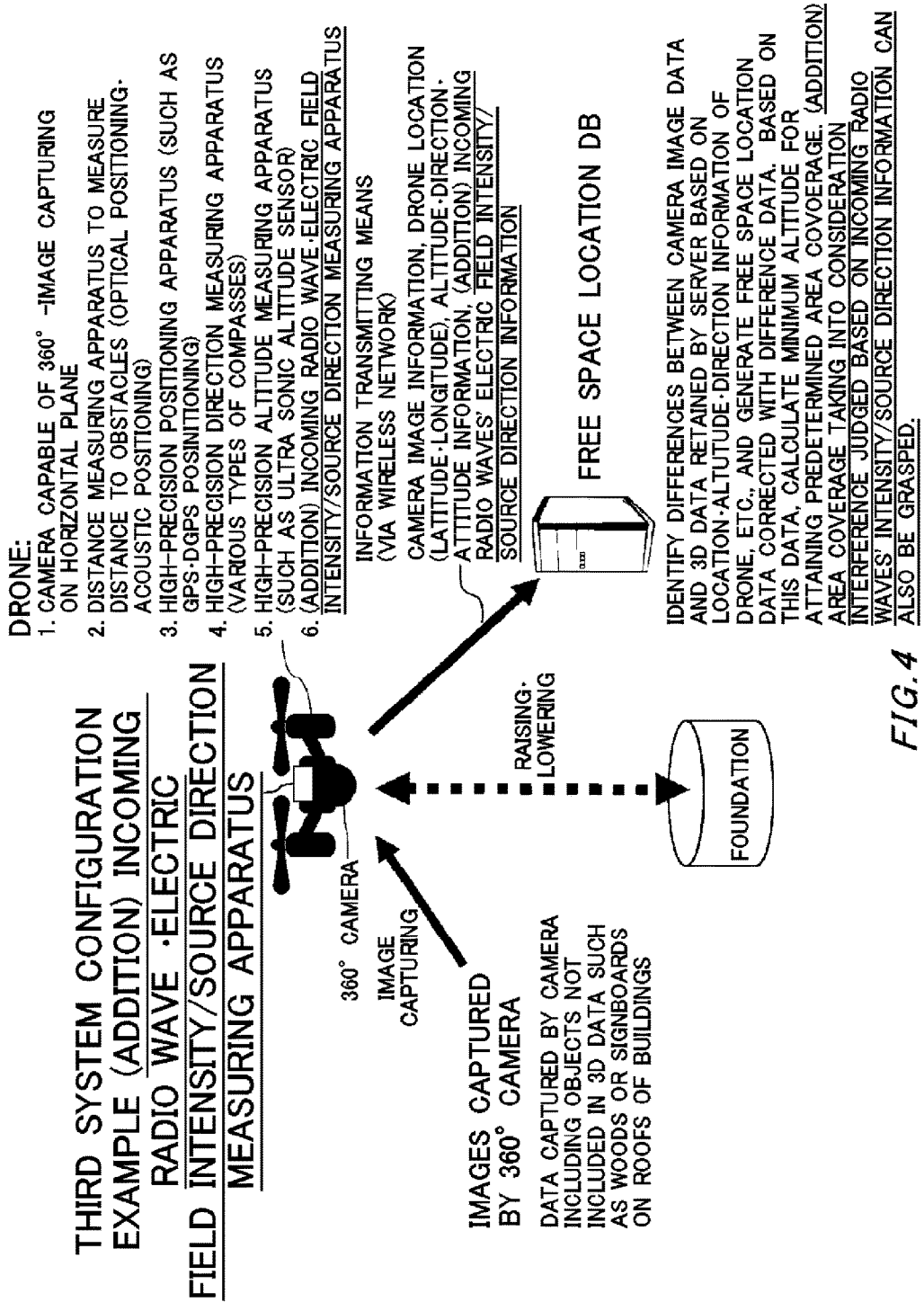
FIG. 4 schematically illustrates a third system configuration example.
Figure 5:
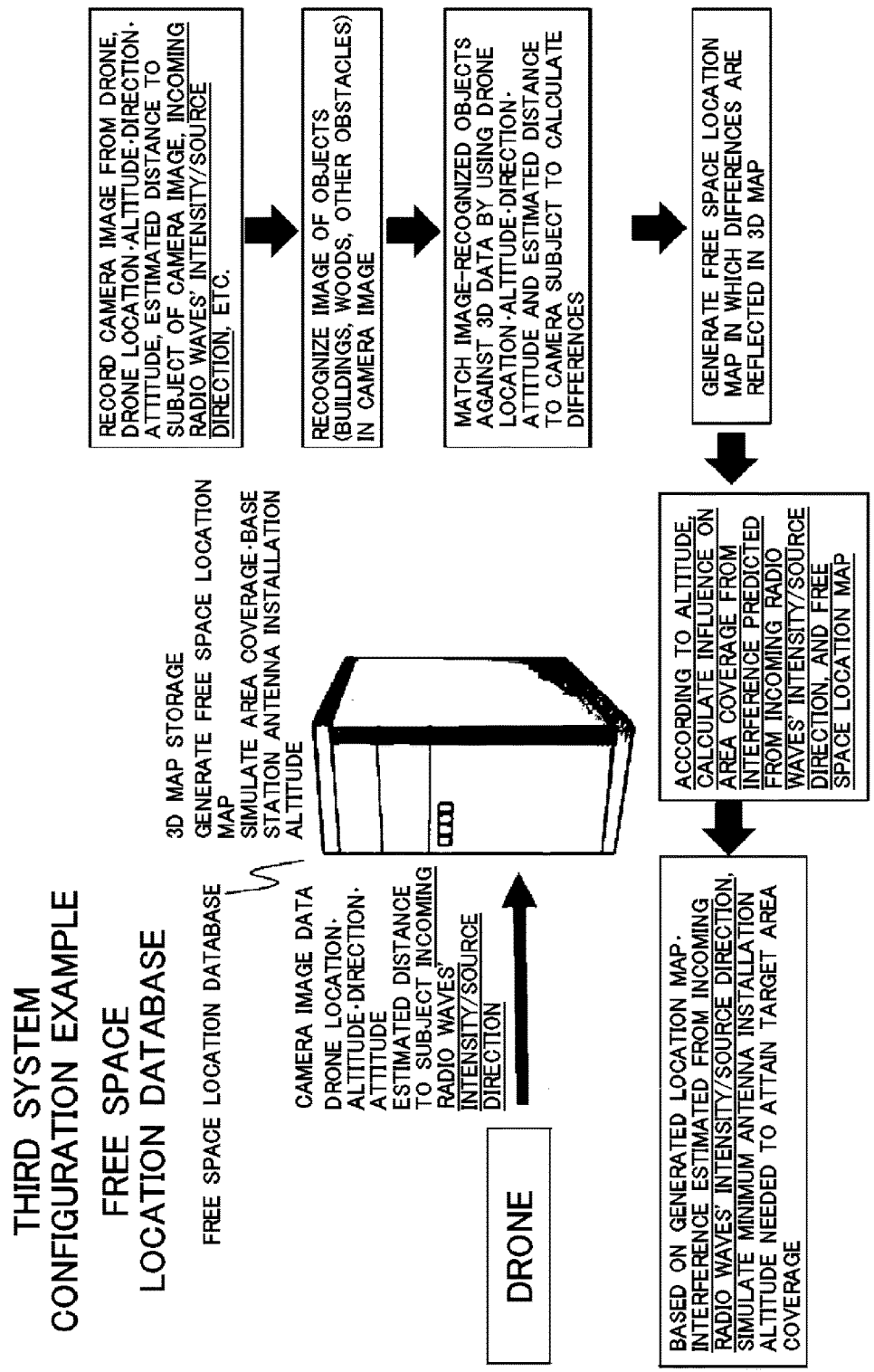
FIG. 5 schematically illustrates one example of a free space location database.

Hereinafter, some embodiments of the present invention will be described. The embodiments do not limit the invention according to the claims, and all the combinations of the features described in the embodiments are not necessarily essential to means provided by aspects of the invention.

While raising the altitude of a drone, camera-image capturing (or moving image capturing) is performed at every predetermined altitude (for example, every one meter) by using a camera that is mounted on the drone and is capable of 360°-image capturing at least on a horizontal plane, and images of surrounding buildings and woods are captured. The captured images and 3D data (terrain information/building information) are matched against each other based on the location/altitude/direction of the drone at the time of the image capturing to identify differences therebetween, and free space location data in which portions with the differences from the 3D data have been corrected is created. By using this free space location data, the accuracy of simulation results about a minimum antenna installation altitude needed is improved.

Specific Operation Example (1) A drone is housed in a foundation that is capable of moving. The drone is provided with a camera capable of 360°-image capturing, and a function of measuring the location (latitude/longitude) and altitude/direction of the drone, and the attitude of the drone.

(2) The altitude of the drone is raised. The drone performs image capturing automatically with the camera every time it is raised by a predetermined height, e.g., one meter.

(3) When the drone determines that it has been raised by a predetermined height, e.g., 50 m, image capturing is terminated, the altitude of the drone is lowered, and the drone is housed in the foundation.

(4) Images captured by the drone, the location/altitude/direction of the drone, and the attitude of the drone are automatically transmitted to a free space location database.

(5) In the free space location database, differences between the camera image data and 3D data retained by a server are identified based on the location/altitude/direction information of the drone, and the drone attitude information, and free space location data that has been corrected with the difference data is generated. Simulation about a minimum antenna installation altitude needed to attain predetermined area coverage is performed in base station designing.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A system comprising:
an unmanned aerial vehicle; and
a free space location database, wherein
the unmanned aerial vehicle has:
   a camera that is capable of 360°-image capturing on a horizontal plane;
   a positioning apparatus that measures a location of the unmanned aerial vehicle;
   a direction measuring apparatus that measures a direction of the unmanned aerial vehicle;
   an altitude measuring apparatus that measures an altitude of the unmanned aerial vehicle; and
   an information transmitting unit that transmits, to the free space location database, camera image data captured by the camera at every predetermined altitude, and the location, direction and altitude of the unmanned aerial vehicle at time of image capturing by the camera, and
based on the camera image data, and the location, direction and altitude of the unmanned aerial vehicle, the free space location database corrects 3D data including terrain information to generate free space location data.

2. The system according to claim 1, wherein based on the free space location data, the free space location database performs simulation of a minimum antenna installation altitude needed to attain predetermined area coverage in base station setting.

3. The system according to claim 1, wherein the altitude measuring apparatus measures the altitude of the unmanned aerial vehicle by using an ultrasonic altitude sensor.

4. The system according to claim 1, further comprising a reel winding-type mooring cable attached to the unmanned aerial vehicle and a foundation to house the unmanned aerial vehicle, wherein
the altitude measuring apparatus handles a cable length measured by a reel of the reel winding-type mooring cable as the altitude of the unmanned aerial vehicle.

5. The system according to claim 4, further comprising the foundation, wherein
the foundation has a function of housing the unmanned aerial vehicle, a reel-type mooring function, and a truck.

6. The system according to claim 1, wherein
the unmanned aerial vehicle further has a measuring apparatus that measures an intensity/a source direction of incoming radio waves, and
the information transmitting unit transmits the intensity/source direction of the incoming radio waves to the free space location database.

7. The system according to claim 6, wherein based on the free space location data, and interference predicted from the intensity/source direction of the incoming radio waves, the free space location database performs simulation of a minimum antenna installation altitude needed to attain predetermined area coverage in base station setting.

8. The system according to claim 1, wherein
the unmanned aerial vehicle further has a distance measuring apparatus that measures a distance to a subject of a camera image captured by the camera,
the information transmitting unit transmits, to the free space location database, the distance in addition to the camera image data, the location, the direction and the altitude, and based on the camera image data, the location, direction and altitude of the unmanned aerial vehicle, and the distance to the subject, the free space location database corrects 3D data including terrain information to generate free space location data.

9. An unmanned aerial vehicle comprising:
a camera that is capable of 360°-image capturing on a horizontal plane;
a positioning apparatus that measures a location of the unmanned aerial vehicle;
a direction measuring apparatus that measures a direction of the unmanned aerial vehicle;
an altitude measuring apparatus that measure an altitude of the unmanned aerial vehicle;
a measuring apparatus that measures an intensity/a source direction of incoming radio waves; and
an information transmitting unit that transmits camera image data captured by the camera at every predetermined altitude, the location, direction and altitude of the unmanned aerial vehicle at time of image capturing by the camera, and the intensity/source direction of incoming radio waves.

10. A server comprising a free space location database that receives, from an unmanned aerial vehicle, camera image data, and a location, a direction and an altitude of the unmanned aerial vehicle at time of image capturing by a camera, and, based on the camera image data, and the location, direction and altitude of the unmanned aerial vehicle that have been received, corrects 3D data including terrain information to generate free space location data, wherein
the unmanned aerial vehicle has:
the camera that is capable of 360°-image capturing on a horizontal plane;
a positioning apparatus that measures the location of the unmanned aerial vehicle;
a direction measuring apparatus that measures the direction of the unmanned aerial vehicle;
an altitude measuring apparatus that measures the altitude of the unmanned aerial vehicle; and
an information transmitting unit that transmits the camera image data captured by the camera at every predetermined altitude, and the location, direction and altitude of the unmanned aerial vehicle at time of image capturing by the camera.

* * * * *